United States Patent
Hasegawa et al.

(10) Patent No.: US 6,868,007 B2
(45) Date of Patent: Mar. 15, 2005

(54) SEMICONDUCTOR MEMORY SYSTEM WITH A DATA COPYING FUNCTION AND A DATA COPY METHOD FOR THE SAME

(75) Inventors: Takehiro Hasegawa, Yokohama (JP); Hiroshi Sukegawa, Tokyo (JP); Tamio Saimen, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 70 days.

(21) Appl. No.: 10/322,321

(22) Filed: Dec. 17, 2002

(65) Prior Publication Data

US 2003/0117846 A1 Jun. 26, 2003

(30) Foreign Application Priority Data

Dec. 20, 2001 (JP) ...................................... 2001-388327

(51) Int. Cl.$^7$ .............................................. G11C 16/06
(52) U.S. Cl. ........................... 365/185.09; 365/185.05; 365/185.29; 365/185.33; 365/200
(58) Field of Search ....................... 365/185.09, 185.05, 365/185.29, 185.33, 200

(56) References Cited

U.S. PATENT DOCUMENTS

| | | | | |
|---|---|---|---|---|
| 6,157,570 A | * | 12/2000 | Nachumovsky | ........ 365/185.18 |
| 6,266,273 B1 | | 7/2001 | Conley et al. | ......... 365/185.04 |
| 6,292,392 B1 | * | 9/2001 | Fukui | ................... 365/185.11 |
| 6,560,143 B2 | * | 5/2003 | Conley et al. | ......... 365/185.04 |

* cited by examiner

Primary Examiner—Richard Elms
Assistant Examiner—Pho M. Luu
(74) Attorney, Agent, or Firm—Hogan & Hartson, LLP

(57) ABSTRACT

A semiconductor memory system having a nonvolatile memory and a controller configured to control the nonvolatile memory. The controller causes management data for page data to be inputted to a redundant area of the nonvolatile memory before the execution of a program and, when moving the page data in the nonvolatile memory to one other page, controls the reading of the page data to check the page data for errors during a program period for the one other page.

10 Claims, 8 Drawing Sheets

SEMICONDUCTOR MEMORY SYSTEM WITH A DATA COPYING FUNCTION AND A DATA COPY METHOD FOR THE SAME

CROSS-REFERENCE TO RELATED APPLICATIONS

This application is based upon and claims the benefit of priority from the prior Japanese Patent Application No. 2001-388327, filed Dec. 20, 2001, the entire contents of which are incorporated herein by reference.

BACKGROUND OF THE INVENTION

1. Field of the Invention

This invention relates to a semiconductor memory system with a data copying function and a data copying method for the memory system, and more particularly to the technique for rewriting data in pages in a NAND flash memory where data is erased in blocks.

2. Description of the Related Art

One known nonvolatile semiconductor memory device is a NAND flash memory. In a NAND flash memory, memory cells are cascade-connected, thereby reducing the number of contacts for the select gates and bit lines, which makes the chip size smaller than that of a NOR flash memory. However, the data cannot be erased in pages and has to be erased in blocks (or in units of pages sandwiched between select gates). Therefore, although the chip size can be made smaller, the user must erase or rewrite the data in larger units (or in blocks). This limitation makes it complicated to use the NAND flash memory.

In a case where data can be erased in pages as in a NOR flash memory, to rewrite page data, the original page is erased and the page data to be overwritten is programmed there. In contrast, in a NAND flash memory, since data has to be erased in blocks, not only the page to be erased but also the remaining pages in the same block are also erased. For this reason, to write data into a physical page data area in which data has already been written, the data in the remaining pages in the same block has to be read and saved and, after the block is erased, the saved data has to be programmed again.

Such a rewrite operation is very complex and takes time. Thus, when data is rewritten in pages, a method of programming the rewritten data physically into other empty blocks (or erased blocks) is used. In this method, however, physical addresses of the page data change. For this reason, the process of causing the physically changed addresses to correspond to apparent addresses seen from the outside is required. Generally, this process is carried out at a controller.

To cause externally seen addresses to correspond to internal physical addresses, a method of making a table for each page has been proposed. When a conversion table is made for each page, this makes the data size of the conversion tables larger. Therefore, the former is generally caused to correspond to the latter in units of a plurality of pages.

As described above, in a NAND flash memory, to rewrite data in pages, it is necessary to copy the remaining pages in the same replacement unit (block) into the move destination block.

Two conventional methods of copying page data into another page in a NAND flash memory will be explained in further detail by reference to flowcharts in FIGS. 1 and 2. In a first method, page data is read temporarily into the page buffer in the chip as shown in FIG. 1 (STEP 1). Next, the address for the copy destination page is inputted (STEP 2). Then, a program command is inputted (STEP 3) to read the statues (STEP 4).

In the first method, if an error has occurred in part of the data when the data is read into the page buffer, the erroneous data is programmed directly into another page. If a similar page copy of the page has been made and a new error has occurred, it follows that the preceding errors and the newly occurred error are programmed. As described above, in the conventional page copying operation, even if an error has occurred in reading, it cannot be detected. When a copy is made many times, errors can accumulate.

Another method (a second method) of copying page data into another page is to carry out normal read and write operations as shown in FIG. 2. In this method, first, the page data is read outside the chip (STEP 1, STEP 2). Next, the address for the copy destination address is inputted (STEP 3) and the read-out page data, or the previously outputted page data, is inputted (STEP 4). Thereafter, a program command is inputted (STEP 5) and the status is read (STEP 6).

In the second method, since the page data is read temporarily outside the chip, if an error has occurred in part of the page data, it is possible to detect and correct the error at a controller. However, since the page data is read outside the chip and the data is then inputted to the copy destination address again, it takes time to carry out the copy operation.

BRIEF SUMMARY OF THE INVENTION

According to an aspect of the present invention, there is provided a semiconductor memory system comprising: a nonvolatile memory which includes a memory cell array with memory cells of a NAND cell structure, a sense amplifier which amplifies data to be written into memory cells in the memory cell array and amplifies the data read from memory cells in the memory cell array, a page buffer which receives the page data outputted from the sense amplifier, a row decoder and control circuit which decodes a row address signal and controls the operation of the circuitry provided in the nonvolatile memory, a first decoder which decodes an address for a page copy destination and a data input command and controls the operations of the row decoder and control circuit, the sense amplifier, and the page buffer, and a second decoder which decodes an address for an ordinary program and a data input command and controls the operations of the row decoder and control circuit, the sense amplifier, and the page buffer; and a controller which includes a command issuing circuit which issues a command and supplies the command to the first decoder and the second decoder, an ECC circuit which corrects collapsed data in the buffer memory, when there is an error in the page data and the error is correctable, and a buffer memory with a data size necessary for at least one program.

According to another aspect of the present invention, there is provided a semiconductor memory system data copying method comprising: inputting management data for page data to a redundant area of a nonvolatile memory; executing a program; and, when moving the page data in the nonvolatile memory to one other page, reading the page data during a program period for the one other page to check the page data for errors.

DETAILED DESCRIPTION OF THE INVENTION

[First Embodiment]

Figure 1:
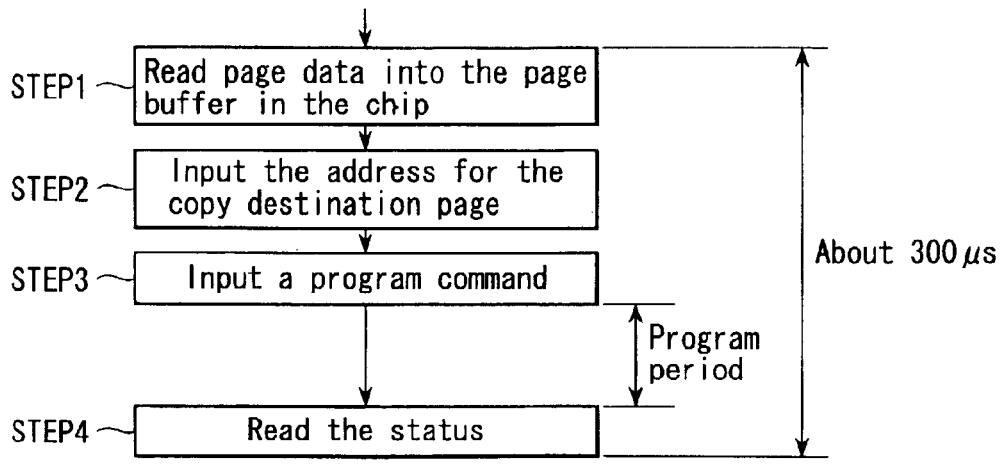
FIG. 1 is a flowchart to help explain a method (a first method) of copying page data into another page in a conventional nonvolatile semiconductor memory device.
Figure 2:
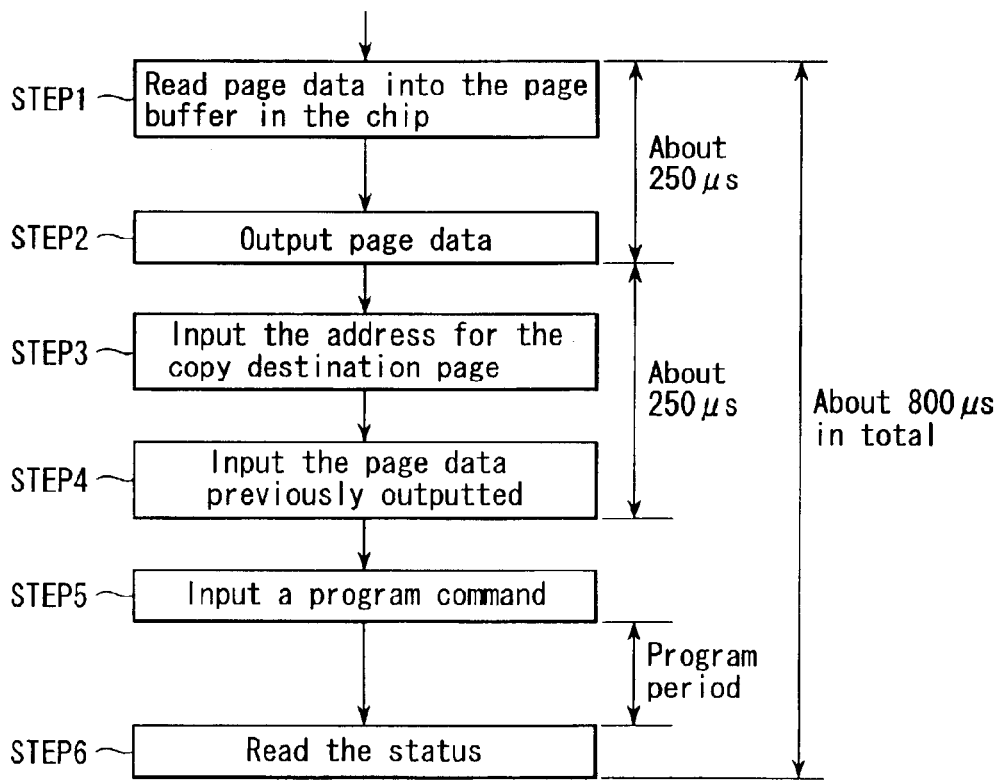
FIG. 2 is a flowchart to help explain another method (a second method) of copying page data into another page in a conventional nonvolatile semiconductor memory device.
Figure 3:
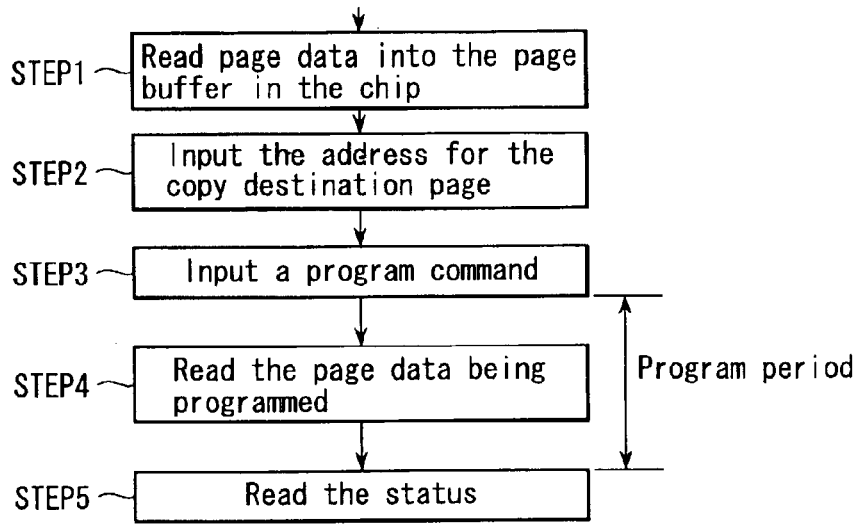
FIG. 3 is a flowchart for the procedure a controller follows in controlling the operation of a memory, which helps explain a semiconductor memory system according to a first embodiment of the present invention and a data copying method for the memory system.

FIG. 3 is a flowchart for the procedure a controller follows in controlling a memory, which helps explain a semiconductor memory system according to a first embodiment of the present invention and a data copying method for the memory system. First, page data is read into a page buffer in a chip (STEP 1). After the address for the copy destination page is inputted (STEP 2), a program command is inputted (STEP 3) and then the page data starts to be programmed into memory cells at the copy destination. After the programming is started, the page data being programmed and the status are read outside (STEP 4, STEP 5).

Reading the page data being programmed outside enables an external controller outside the nonvolatile semiconductor memory device (or chip) to check whether there is any error in the data being programmed.

The chip of the nonvolatile semiconductor memory device has the function of reading the page data outside during a program period as compared with a conventional copy sequence. In this case, since the chip has the function of reading the page data outside during the program period, it is possible to check whether there is any error during the program period. This makes it possible to check for errors, while apparently hiding the time required to check for errors. To perform such control, the memory has to be provided with a command to read the data outside during the program period and a controller for controlling the memory.

Figure 4:
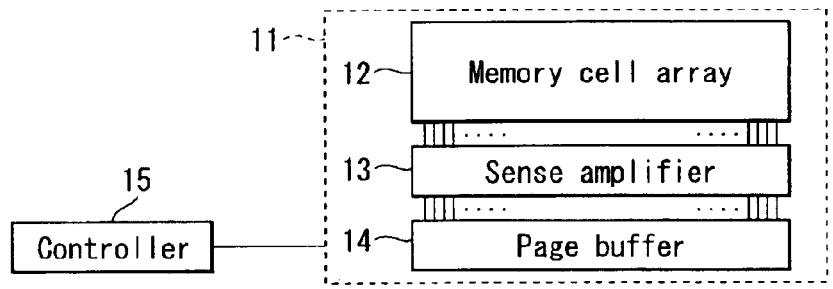
FIG. 4 is a block diagram showing a schematic configuration of a semiconductor memory system which realizes the operation shown in FIG. 3.

FIG. 4 is a block diagram showing a schematic configuration of a semiconductor memory system that realizes the operation as shown in FIG. 3. A memory section (the chip of the nonvolatile semiconductor memory device) 11 includes a memory cell array 12, a sense amplifier 13, and a page buffer 14. In the memory cell array 12, nonvolatile memory cells are arranged in a matrix. The sense amplifier 12 amplifies the data to be written into memory cells in the memory cell array 12 and amplifies the data read from memory cells in the memory cell array 12. The page buffer 14 stores the page data. The memory section 11 is controlled by a controller 15. The page data read from the memory cell array 12 is latched in the sense amplifier 13 and is transferred to the page buffer 14. Then, while the data amplified at the sense amplifier 13 is being programmed into the copy destination page, the sense amplifier 13 is disconnected from the page buffer 14 and the page data in the page buffer 14 is read outside. This makes it possible to read the page data without affecting the program operation. To prevent the program operation from being affected by noise caused by the output buffer when the page data is read outside the chip, it is desirable that the ground potential for the output buffer should be separated from the ground potential inside the chip.

Figure 5:
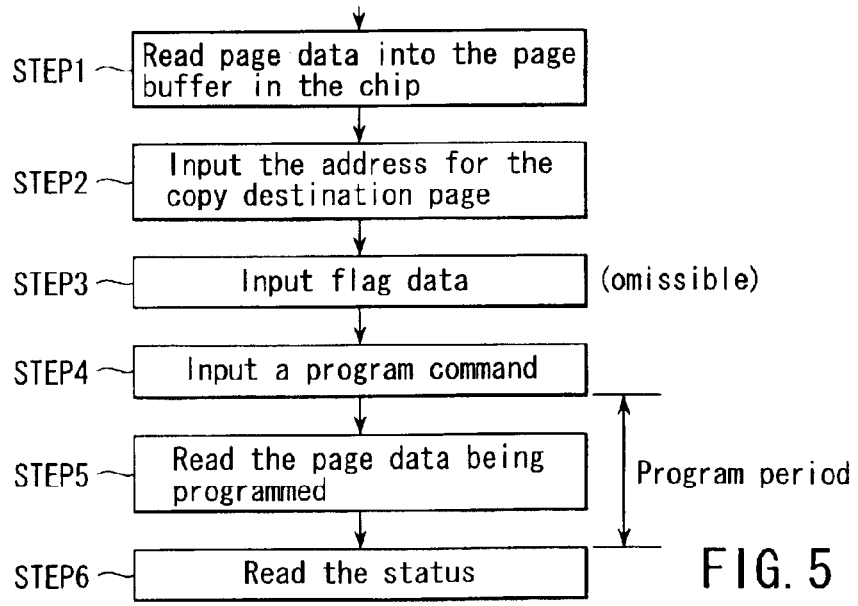
FIG. 5 is a flowchart for the procedure a controller follows in controlling the operation of a memory, which helps explain modifications of the semiconductor memory system according to the first embodiment and the data copying method for the memory system.

FIG. 5 is a flowchart for the procedure the controller 15 follows in controlling the operation of the memory, which helps explain modifications of the semiconductor memory system according to the first embodiment and the data copying method for the memory system. The basic operation is the same as in the first embodiment. First, page data is read into the page buffer in the chip (STEP 1). After the address for the copy destination page is inputted (STEP 2), the management data (the management data can be included the flag data representing data state or file management data) for the data is written into the redundant area of the page (STEP 3). Thereafter, as in the first embodiment, a program command is inputted (STEP 4) and then the page data starts to be programmed into memory cells at the copy destination. After the programming is started, the page data being programmed and the status are read outside (STEP 5, STEP 6).

In this embodiment, the data to describe the fact that the page has been copied can be stored. Here, the management data is flag data. For example, only when it is already known that there is an error in the read-out data and the data needs to be corrected, the erroneous part of the page data may be written for correction in writing the flag data and then the program may be executed. The time required to carry out the entire copy operation becomes longer because the flag data is written before the execution of the program. However, since the management data to be written generally contains several bits or bytes, the time required to write the data does not increase much as a whole. Moreover, when the flag data is written, a part of the page data can also be written. The management data is not necessarily written. Depending on the method of controlling the controller 15, the preparation of such a function as an operation in the chip is effective.

In a case where the modification of the first embodiment is used, when there is an error in the page data to be copied and the error is correctable, it is necessary to stop a series of copy operations carried out up to this time and write the data again into another erased block.

Figure 6:
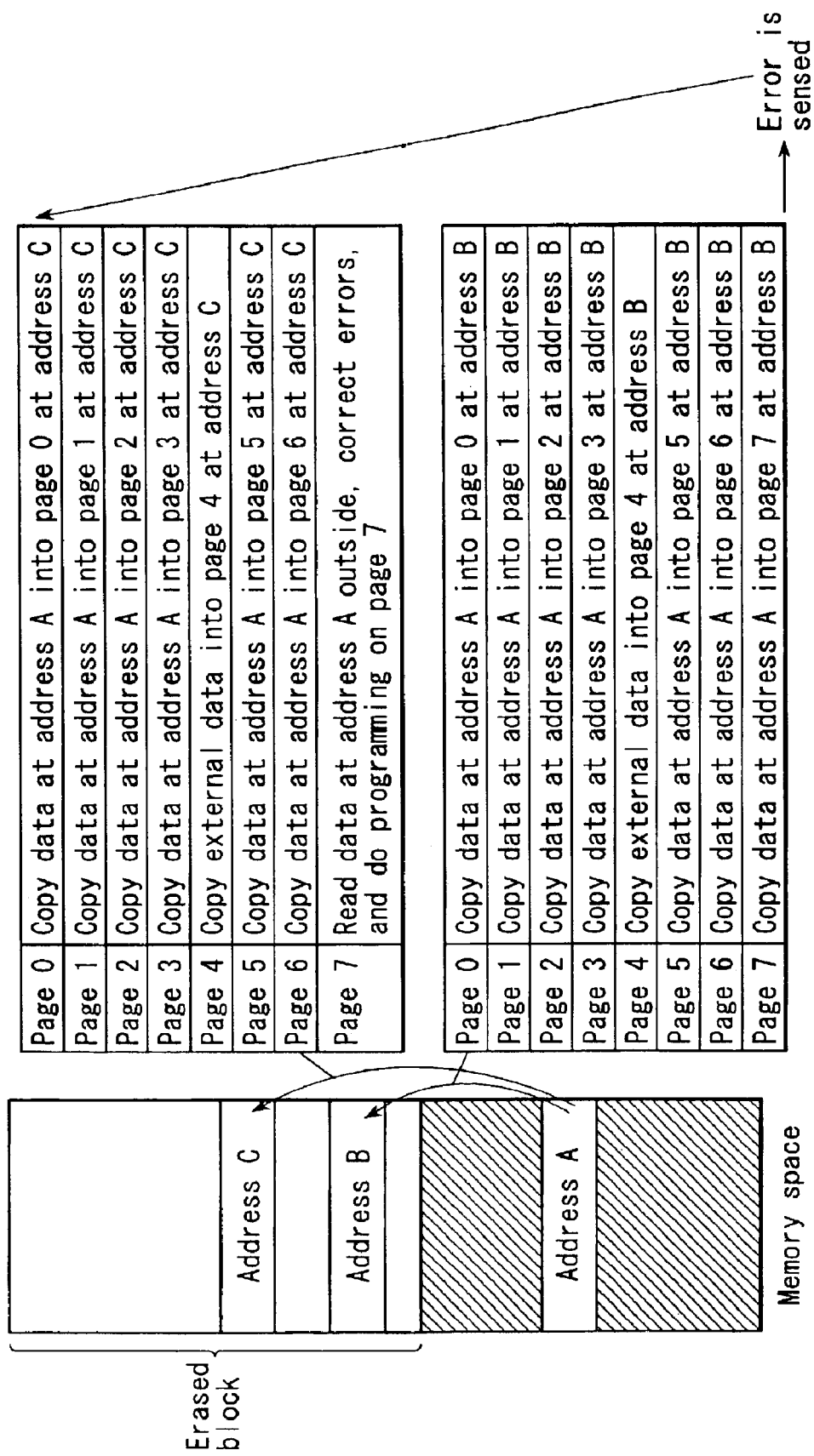
FIG. 6 is a pictorial diagram to help explain a processing method when an error is detected in the semiconductor memory system according to the first embodiment.

FIG. 6 shows how processing is done when an error has been detected in the data on page 7 in a case where the page data is managed in units of 8 pages using an address conversion table and the data on page 4 at address A is rewritten. As for page 0 to page 3, the page data on each of page 0 to page 3 at address A is copied into erased address B by a method as shown in FIG. 3. Because page 4 has the data to be rewritten, externally inputted page data is written into address B. The page data on page 5 to page 7 at address A are copied into page 5 to page 7 at address B by the method as shown in FIG. 3. An error has been detected in the data during the copy program period for page 7. At this time, after the program on page 7 is completed, the controller 15 performs the same operation on another erased location (address C). As for page 0 to page 3, the page data on each of page 0 to page 3 at address A is copied into erased address C by the method as shown in FIG. 3. Because page 4 has the data to be rewritten, externally inputted page data is written into address C. The page data on page 5 to page 6 at address A is copied into page 5 to page 6 at address C by the method as shown in FIG. 3. Because it is already known that there is an error on page 7, normal page reading is done and the data is read into the inside of the controller 15 and corrected there. Thereafter, the corrected page data is written into the chip and programming is done on page 7 at address C. This enables the processing when an error has been detected.

Figure 7:
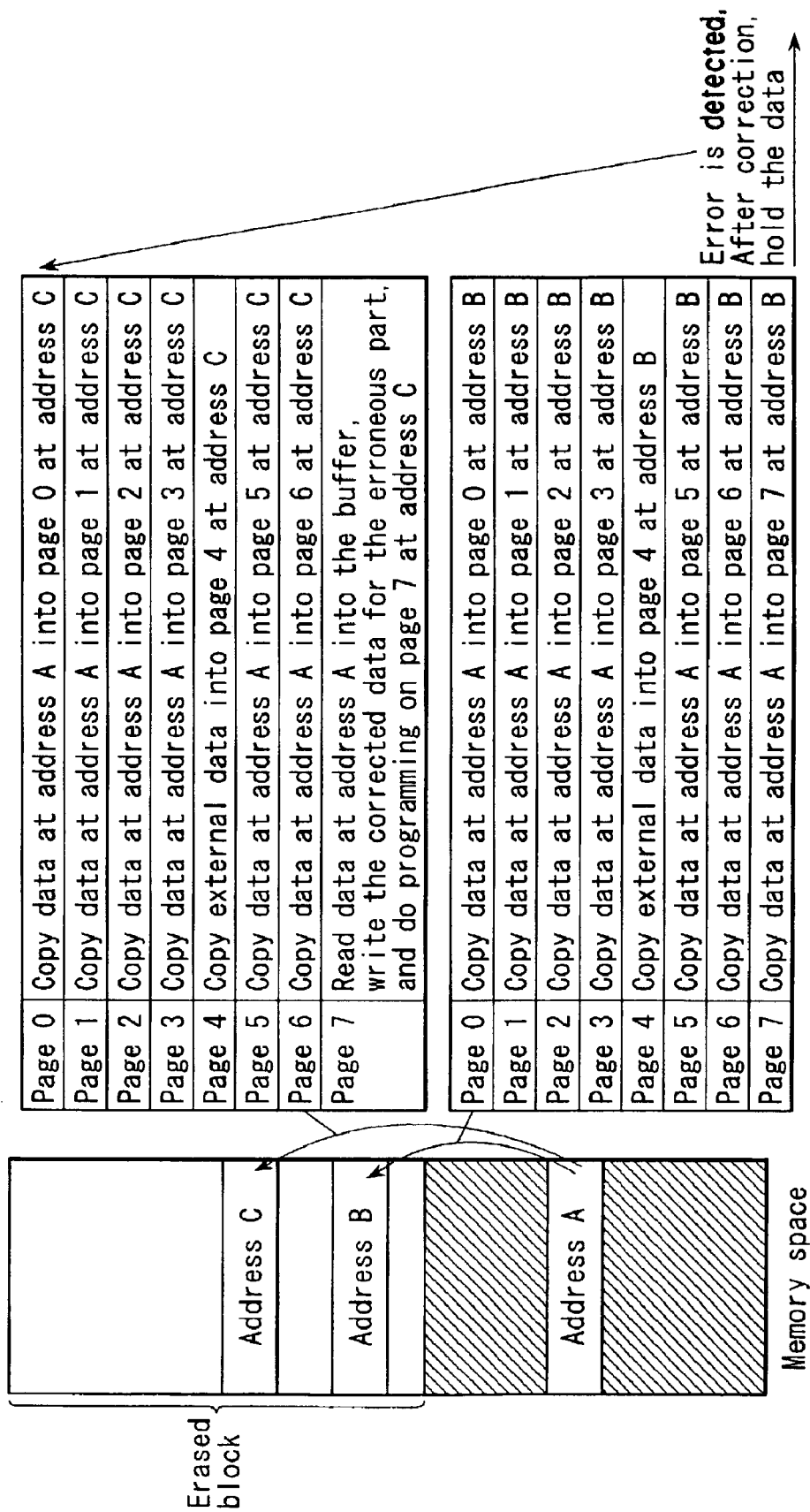
FIG. 7 is a pictorial diagram to help explain a processing method when an error is detected in a modified operation in the semiconductor memory system according to the first embodiment.

FIG. 6 has shown the case where the data corrected in the controller 15 when a first error was found cannot be held. FIG. 7 shows an example of control in a case where an error is detected and corrected at the same time in the controller 15 and there is provided such a memory as can hold the address where the error occurred, the bits, and the restored data.

First, as for page 0 to page 3, the page data on each of page 0 to page 3 at address A is copied into erased address B by the method as shown in FIG. 3. Because page 4 has the data to be rewritten, externally inputted page data is written into address B. The page data in page 5 to page 7 at address A is copied into page 5 to page 7 at address B by the method as shown in FIG. 3. An error has been detected in the data during the copy program period for page 7. At this time, the controller 15 does the work of correcting the error and stores the address where the error occurred and the bits. In addition, after the program on page 7 is completed, the controller 15 performs the same operation on another erased location (address C). As for page 0 to page 3, the page data on each of page 0 to page 3 at address A is copied into erased address C by the method as shown in FIG. 3. Because page 4 has the data to be rewritten, externally inputted page data is written into address C. The page data on page 5 to page 6 at address A is copied into page 5 to page 6 at address C by the method as shown in FIG. 3. It is already known that there is an error in page 7. Therefore, a copy operation as shown in FIG. 5 is carried out. Because the erroneous bits have already been stored, the erroneous bits are written into for correction before the program operation. Thereafter, page 7 at address C is programmed. This enables the processing when an error has been detected. In this case, because it is not necessary to write all of the page data, the correction time is shortened. In this example, when an error is detected, the other page data having the same management address also has to be written into another erased block (in this example, meaning the data on page 0 to page 6). Therefore, if an error is detected, the processing time becomes long. However, since the probability that an error will occur is generally very low, the processing time does not have a great impact against the entire performance.

Therefore, the first embodiment is capable of reducing errors and shortening the copy time. In addition, the first embodiment is capable of moving the page data within the same chip at a higher speed than a conventional equivalent, while checking for errors.

[Second Embodiment]

Figure 8:
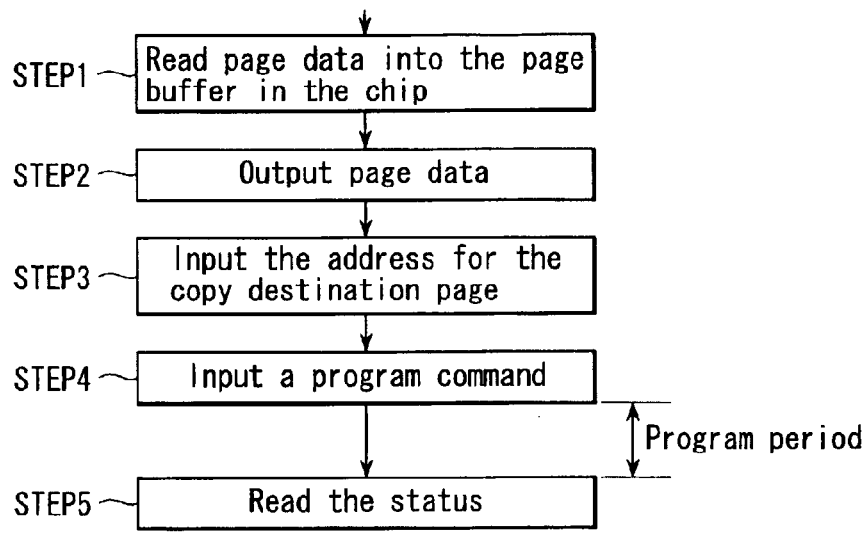
FIG. 8 is a flowchart for the procedure a controller follows in controlling the operation of a memory, which helps explain a semiconductor memory system according to a second embodiment of the present invention and a data copying method for the memory system.

FIG. 8 is a flowchart for the procedure a controller follows in controlling a memory, which helps explain a semiconductor memory system according to a second embodiment of the present invention and a data copying method for the memory system. First, page data is read into a page buffer in a chip (STEP 1). Then, the page data is read outside (STEP 2). Next, the address for the copy destination page is inputted (STEP 3) and a program is executed (a program command is inputted (STEP 4) and the status is read (STEP 5)). This makes it possible to check for an error that might be present when the page data is copied. Although in the second embodiment, the time required to read the page data outside is longer than that in a conventional copy operation, the presence or absence of an error can be checked reliably. Moreover, as compared with a conventional method (second method) of reading the page data outside the chip, inputting the address for the copy destination again, and then inputting the page data, there is no need to input the page data, which makes the time shorter. The controller makes use of this, which enables the page data to be copied into another location in the chip. In addition, output noise explained in the first embodiment has no effect on the program operation, which enables a stable program operation.

Figure 9:
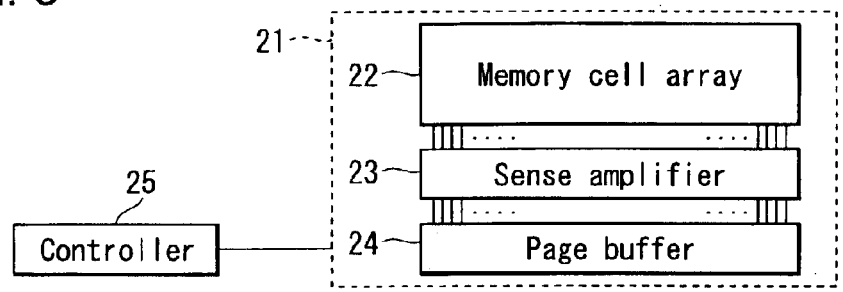
FIG. 9 is a block diagram showing a schematic configuration of the-semiconductor memory system according to the second embodiment.

FIG. 9 is a block diagram showing a schematic configuration of the semiconductor memory system according to the second embodiment. Basically, the semiconductor memory system has the same configuration as that of FIG. 4. A memory section (a chip of a nonvolatile semiconductor memory device) 21 includes a memory cell array 22, a sense amplifier 23, and a page buffer 24. The memory section 21 is controlled by a controller 25. The page data read from the memory cell array 22 is latched in a sense amplifier 23 and is transferred to the page buffer 24. Then, the page data is read from the page buffer 24 to an external circuit. Thereafter, the program is executed.

Figure 10:
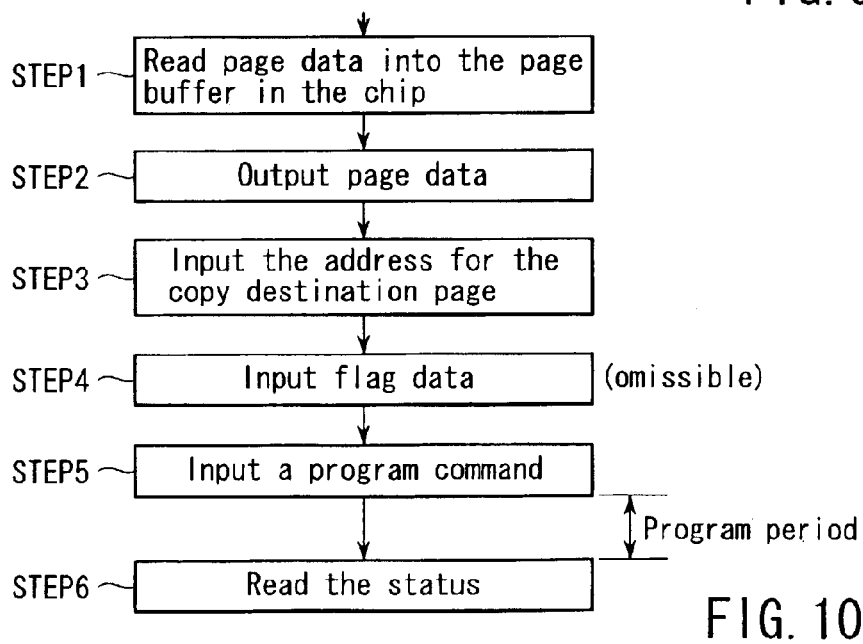
FIG. 10 is a flowchart to help explain modifications of the semiconductor memory system according to the second embodiment and the data copying method for the memory system.

FIG. 10 is a flowchart to help explain modifications of the semiconductor memory system according to the second embodiment and the data copying method for the memory system. After the data is read from the page buffer 23 to an external circuit (STEP 1), the address for the copy destination is inputted and further the management data (the management data can be included the flag data representing data state or file management data) for the page data is inputted. The remaining basic operations are basically the same as those in the first embodiment. For instance, only when there is an error in the read-out data and the error has to be corrected, the erroneous part of the page data may be written into for correction in writing the flag data, followed by the execution of the program.

Figure 11:
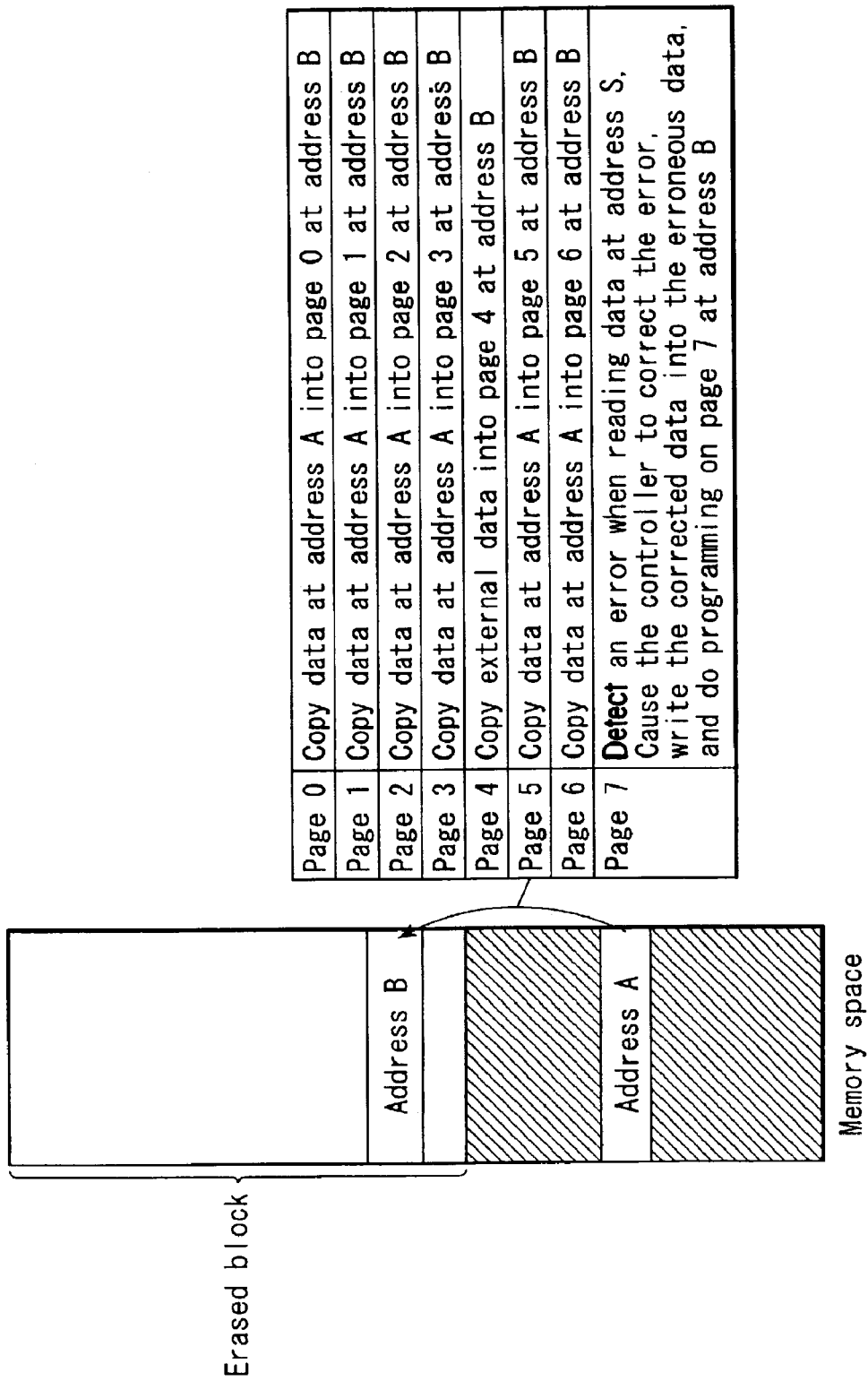
FIG. 11 is a pictorial diagram to help explain the semiconductor memory according to the second embodiment and a processing method when an error is detected in a modified operation in the data copying method for the memory system.

FIG. 11 shows how processing is done when an error has been detected in the data on page 7 in a case where the page data is managed in units of 8 pages using an address conversion table and the data on page 4 at address A is rewritten. As for page 0 to page 3, the page data on each of page 0 to page 3 at address A is copied into erased address B by the method as shown in FIG. 10. Because page 4 has the data to be rewritten, externally inputted page data is written into address B. The page data on page 5 to page 7 at address A is copied into page 5 to page 7 at address B by the method as shown in FIG. 10. An error has been detected in the data after the reading of page 7. At this time, the controller 25 does the work of correcting the error and writes the corrected data into the bit in the page buffer where the error occurred. Thereafter, page 7 at address B is programmed. In a case where control is performed as described above, when an error has been detected, the error is corrected and the write program is carried out, which completes all the correcting work. There is no need to write the data into another erased block as shown in FIGS. 6 and 7. This produces the effect of shortening the time required for the processes after the occurrence of an error.

Therefore, the second embodiment is capable of reducing errors and shortening the copy time. In addition, the second embodiment is capable of moving the page data within the same chip at a higher speed than a conventional equivalent, while checking for errors.

[Third Embodiment]

Figure 12:
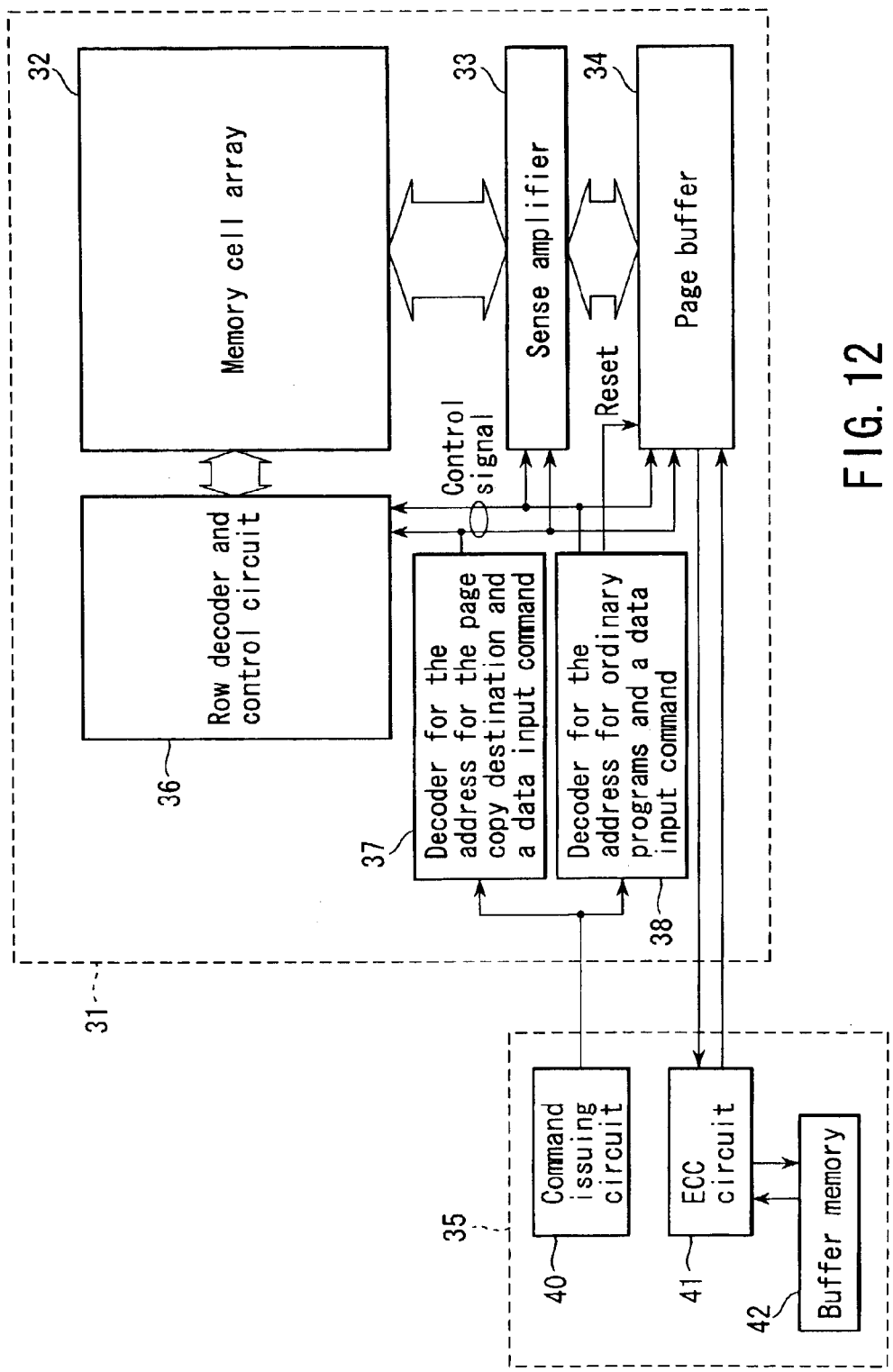
FIG. 12 is a block diagram showing a schematic configuration of the important part of a semiconductor memory system according to a third embodiment of the present invention.

FIG. 12 is a block diagram showing a schematic configuration of the important part of a semiconductor memory system according to a third embodiment of the present invention. A memory section (a chip of a nonvolatile semiconductor memory device) 31 includes a memory cell array 32, a sense amplifier 33, a page buffer 34, a row decoder and control circuit 36, and command decoders 37, 38. In the memory section 31, nonvolatile memory cells are arranged in a matrix. The command decoder 37 decodes the address for the page copy destination and the data input command. The command decoder 38 decodes the address for ordinary programs and a data input command. The command decoders 37, 38 accept the address for ordinary programs, the data input command, the address for the page copy destination, and the data input command in the form of different codes. The address for ordinary programs and the data input command reset the page buffer 34 temporarily and set only the data in the memory cells to be programmed. The reason is to prevent the unnecessary data from being written into the memory cells not to be written into, when a page is divided and written into. On the other hand, in the case of the address used for page copy and the data input command, it is desirable that the data in the part to be corrected should be rewritten in the page buffer 34 and others should be remained in the page buffer 34. Therefore, the address for ordinary programs and the data input command which reset the page buffer 34 at the time of data input cannot be applied, when a page is copied. Thus, it is desirable that the address for ordinary programs and the data input command should be provided independently of the address for page copy and the data input command. The other command decoders that are not related directly to the operation of the third embodiment are omitted in FIG. 12.

The memory section 31 is controlled by the controller 35. The controller 35 includes a command issuing circuit 40, an ECC circuit 41, and a buffer memory 42. The buffer memory 42 has such a data size as is needed to do programming once. The command issued from the command issuing circuit 40 is supplied to the command decoders 37, 38. The operations of the row decoder and control circuit 36, sense amplifier 33, and page buffer 34 are controlled by the control signals outputted from the command decoders 37, 38.

The page data read from the page buffer 34 is supplied to the ECC circuit 41, which corrects errors in the page data when the errors are detected. After the error correction, the corrected page data is stored in the buffer memory 42. The page data stored in the buffer memory 42 is supplied to the ECC circuit 41. The page data and redundant data generated by the ECC circuit 41 are supplied to the page buffer 34.

Further, when an error has been detected by the ECC circuit 41, only erroneous data can be written into the page buffer 34 from the ECC circuit 41.

Next, a concrete page copy operation in the semiconductor memory system of FIG. 12 will be explained. The page copy operation corresponds to that in the first embodiment. First, in a normal read operation, a certain page data item in the memory cell array 32 is read into the page buffer 34 via the sense amplifier 33. Here, the controller 35 issues the address for the page copy destination and a data input command and inputs the address for the copy destination to the memory section 31. Next, the controller 35 executes a program command and programs the data into the page copy destination. In addition, during a program period, the controller 35 issues a command to output the data in the page buffer 34 and reads the page data in the copy source stored in the page buffer 34 into the controller 35. The controller 35 stores the received data into the buffer memory 42 via the ECC circuit 41. If there is no error and the next page copy is necessary, the next page copy operation is started. When it has become clear that correction is needed, the page data is copied into another block as shown in FIG. 6.

Next, another concrete page copy operation will be explained. This page copy operation corresponds to that in the second embodiment. First, in an ordinary read operation, the page data in the memory cell array 32 is read into the page buffer 34 via the sense amplifier 33. The page data is read from the page buffer 34 into the controller 35 through serial output. The controller 35 stores the received data into the buffer memory 42 via the ECC circuit 41. At this time, if there is an error in the page data and the error is correctable, the controller 35 corrects the collapsed data in the buffer memory 42. Next, the controller 35 issues the address for the copy destination and a data input command and inputs the address for the copy destination to the memory section 31. At this time, the page buffer 34 is not reset and has held the data in the copy source already read. When the just read data is not to be corrected (there is no ECC error), the program command is inputted directly, and the data is programmed into the page copy destination. Then, if necessary, a page copy of the next page is made in a similar manner. If there is any correctable error, only the corrected part of the corrected data in the buffer memory 42 is written into the page buffer 34. Alternatively, all of the corrected page data is overwritten. Thereafter, a program command is inputted and the data is programmed into the page copy destination. Then, if necessary, the operation of programming the next page is carried out.

Figure 13:
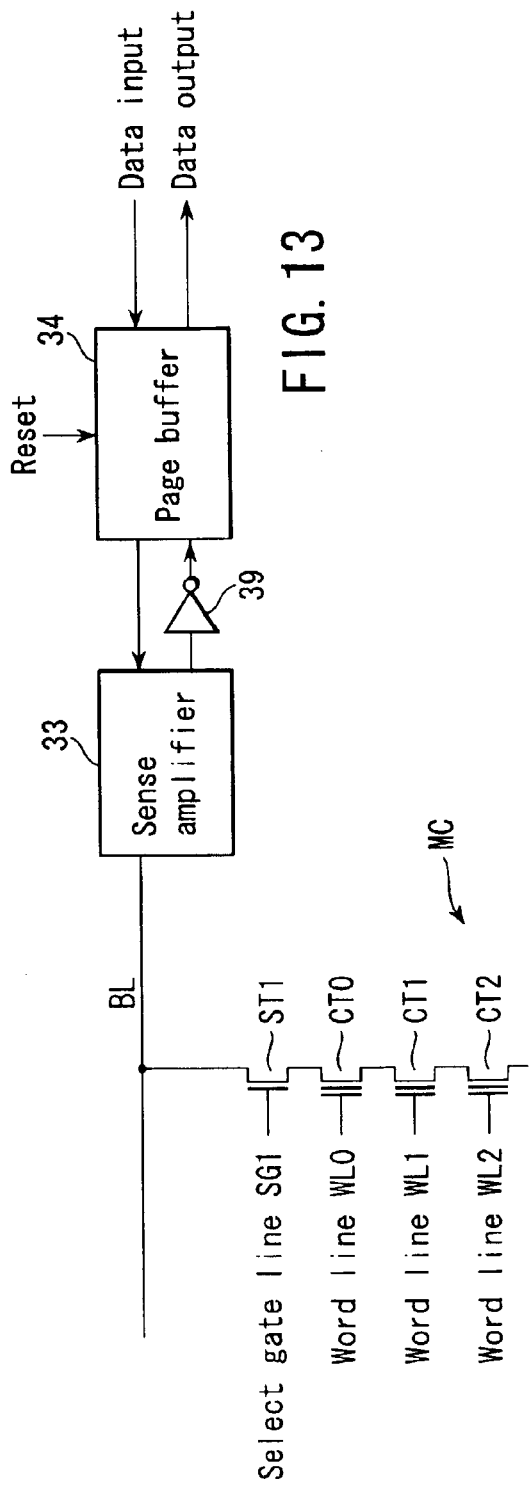
FIG. 13 is a block diagram to help explain the input of data from the outside of the chip to memory cells and the output of data from memory cells to the outside of the chip in the system of FIG. 12, centering on a single column.

FIG. 13 is a block diagram to help explain the input of data from the outside of the chip to memory cells and the output of data from memory cells to the outside of the chip in the circuit of FIG. 12, centering on a part of the circuit. For the sake of simplification, only one column will be explained. Basically, the same holds true for a plurality of bit lines. A NAND flash memory is used as an example of a nonvolatile memory. Not only a memory cell MC with a NAND cell structure but also a sense amplifier 33 for reading the data from the memory cell MC or writing data into the memory cell MC are connected to the bit line BL. The memory cell MC is so constructed that the current paths of a first select transistor ST1, cell transistors CT0, CT1, CT2, . . . , and a second select transistor ST2 are connected in series between the bit line BL and a source line SL. The sense amplifier 33 is so connected that it receives the data from the page buffer 34 with logically the same polarity and it inverts the data logically and transfers the inverted data (with the opposite polarity) to the page buffer 34. That is, the data is transferred via an inverter 39 so that the data to be outputted to the page buffer 34 is inverted with respect to the polarity of the data inputted from the page buffer 34. The page buffer 34 is used to exchange the data with a circuit outside the chip. The data inputted from an external circuit to the page buffer 34 is logically the same polarity and the data outputted to an external circuit is also logically the same polarity. In FIG. 13, nothing is done in the course of data transfer. Whatever thing is inserted into the middle of the data transfer system, the circuit of FIG. 13 is basically the same as the third embodiment, provided that an explanation of the circuit is logically the same as the above explanation.

Figure 14:
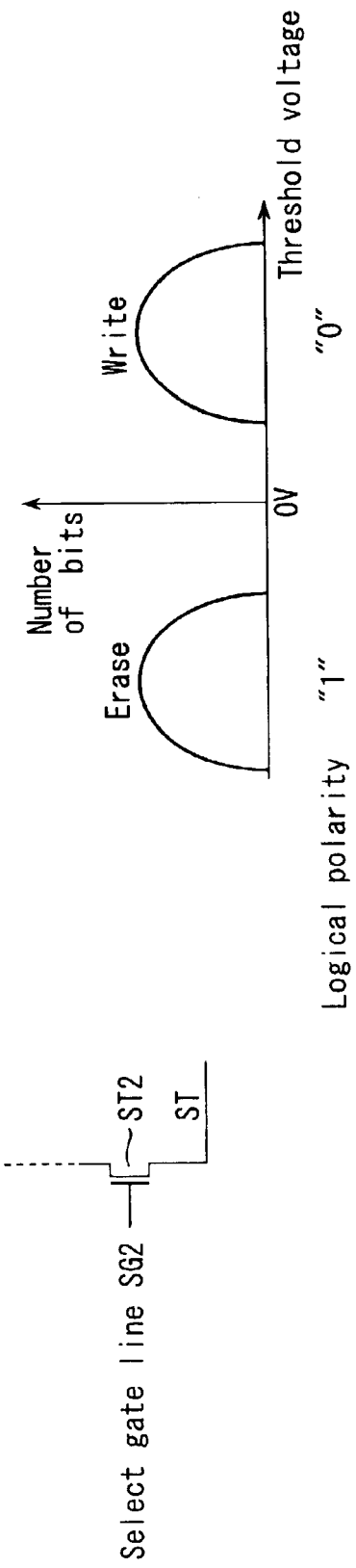
FIG. 14 is a diagram to help explain the logical meaning of the threshold voltage of a cell transistor.

FIG. 14 is a diagram to help explain the logical meaning of the threshold voltages of cell transistors CT0, CT1, CT2, . . . . Here, when the threshold voltages of cell transistors CT0, CT1, CT2, . . . are negative (that is, when they are in the erased state), the state is defined as logical polarity "1." When the threshold voltages of cell transistors CT0, CT1, CT2, . . . are positive (that is, when they are in the programmed state), the state is defined as logical polarity "0."

Explanation will be given, using a case where "0" is written into and read from cell transistor CT1 connected to word line WL1 in FIG. 13. When "0" data is externally inputted, the output of the page buffer 34 has the same polarity and therefore is "0," with the result that the bit line BL is "0" or at the low ("L") level. When programming is done on cell transistor CT1, the bit line BL is set at the low ("L") level, for example, at 0V and the selected word line WL1 is set at the high ("H") level, for example, at 20V, thereby setting the substrate at 0V. In addition, the unselected word lines WL0, WL2, . . . , are set at 10V and select gate line SG1 is set at, for example, 3.3V and select gate SG2 is set at 0V, which causes programming to be done on the cell transistor CT1 connected to the selected word line WL1. Therefore, when "0" data is externally inputted, programming is done on the selected cell transistor CT1, which makes the threshold voltage of the cell transistor CT1 positive.

On the other hand, when the data is read, bit line BL is precharged at 3.3V, the selected word line WL1 is set at 0V, the unselected word line is set at 4.5V, and the source line SL is set at 0V. Since the threshold voltage of the selected cell transistor CT1 is positive, the cell transistor CT1 is in the off state. Therefore, the potential of the bit line BL remains unchanged. The sense amplifier 33 recognizes the data as a high potential. The sense amplifier 33 inverts the data and transfers the inverted data to the page buffer 34. Thus, in the page buffer 34, the data is at a low potential, or logical "0," with the result that "0" is read outside. When "1" has been externally written, the bit line L is "1" and therefore no programming is done on the cell transistor CT1, with the result that the threshold voltage of the cell transistor CT1 remains negative, or in the erased state. To read the value, the procedure is the same as reading logical "0" data except that the polarity of the data is reversed.

As described above, in the NAND flash memory, the potential (the output potential of the sense amplifier 33) of the bit line BL in a write operation differs from that in a read operation, even when the data with the same logical polarity is used. Therefore, to make the polarity equal to that in the outside of the chip, the inverter 39 is provided between the sense amplifier 33 and the page buffer 34 as described in the third embodiment, thereby inverting the data in a read operation. Inverting the data in a read operation eliminates the necessity of performing unnecessary control even in making a page copy and enables the operation to be simplified as described below.

Explanation will be given, using a case where the data in cell transistor CT1 connected to word line WL1 is read and copied into cell transistor CT2 connected to word line WL2. First, the bit line BL is precharged at 3.3V, the selected word line WL is set at 0V, the unselected word lines WL0, WL2, . . . are set at 4.5V. For example, when the threshold voltage of the selected cell transistor CT1 is positive, the transistor CT1 is in the off state. Thus, the potential of the bit line BL remains unchanged. The sense amplifier 33 recognizes the data as a high potential. The data is inverted and the inverted data is transferred to the page buffer 34.

Next, the operation of copying the data read from the cell transistor CT1 into the cell transistor CT2 connected to word line WL2 will be explained. First, the data in the page buffer 34 is transferred to the sense amplifier 33. At this time, the polarity of the sense amplifier 33 is at a low potential, the opposite of that in the read operation. Here, when programming is done on the cell transistor CT2 connected to word line WL22, the selected word line WL2 is set at a high potential, for example, at 20V, the substrate is set at 0V, and the unselected word lines WL0, WL1, . . . are set at 10V. In addition, the select gage line SG1 is set at, for example, 3.3V and the select gate line SG2 is set at 0V. Because the bit line BL is at a low potential (0V), the potential of the cell transistor CT2 connected to word line WL2 is programmed positive. This enables the data in the cell transistor CT1 connected to word line WL1 to be copied into the cell transistor connected to word line WL2. As described above, the same data route can be used in both the page copy and the programming of external input data. That is, because the data route need not be switched between the page copy and the programming, the circuit area can be decreased and therefore the power consumption can be reduced.

Therefore, in the third embodiment, not only can errors be reduced, but also the copy time can be shortened. In addition, the page data is moved at a higher speed within the same chip than a conventional equivalent, while checking for errors.

Note that in the third embodiment described above, copy operation is performed according to cells in one NAND connection, but it is possible to perform basically the same operation on another cells in the other NAND connection.

Here, the data in the first to third embodiments includes redundant data for detecting and correcting errors and data necessary to manage other data items.

In the first to third embodiments, the page length has not been determined. However, the time required to read and write the page data is practically reduced, which produces a greater effect as the page gets longer. Although the address where an error occurred is assumed to be page 7, errors can occur at any page.

Furthermore, although this invention particularly produces a greater effect when it is applied to a memory that erases the data in blocks, as a NAND flash memory, it is not limited to this. For instance, the invention may be applied to a nonvolatile semiconductor memory device with a copying function and its controller.

As described above, since the page data can be read during the page program period, the read time can be decreased. In addition, when the page data is moved within the chip, the extra time required to check for errors can be apparently eliminated. Moreover, when the page data is moved within the chip, management data can be additionally inputted.

When the page data is moved within the chip, the page data can be checked for errors in a shorter time. Furthermore, when the page data is moved within the chip, the management data can be added. Moreover, when the page data is moved within the chip, the page data can be checked for error in a shorter time. In addition, when an error is detected and can be corrected, the data is written into the erroneous part, which enables programming at the move destination. This reduces a loss of time resulting from error correction.

Therefore, it is possible to provide a semiconductor memory system capable of shortening the copying time and a data copying method for the memory system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory system comprising:
   a nonvolatile memory which includes
      a memory cell array with memory cells of a NAND cell structure,
      a sense amplifier which amplifies data to be written into memory cells in the memory cell array and amplifies the data read from memory cells in the memory cell array,
      a page buffer which receives the page data outputted from the sense amplifier,
      a row decoder and control circuit which decodes a row address signal and controls the operation of the circuitry provided in the nonvolatile memory,
      a first decoder which decodes an address for a page copy destination and a data input command and controls the operations of the row decoder and control circuit, the sense amplifier, and the page buffer, and
      a second decoder which decodes an address for an ordinary program and a data input command and controls the operations of the row decoder and control circuit, the sense amplifier, and the page buffer; and
   a controller which includes
      a command issuing circuit which issues a command and supplies the command to the first decoder and the second decoder,
      an ECC circuit which corrects collapsed data in the buffer memory, when there is an error in the page data and the error is correctable, and
      a buffer memory with a data size necessary for at least one program.

2. The semiconductor memory system according to claim 1, wherein the second decoder resets the page buffer and then sets only the data in the memory cells to be programmed.

3. A semiconductor memory system data copying method comprising:
   inputting management data for page data to a redundant area of a nonvolatile memory;
   executing a program; and
   when moving the page data in the nonvolatile memory to one other page, reading the page data during a program period for the one other page to check the page data for errors.

4. A semiconductor memory system data copying method comprising:
   inputting management data for page data to a redundant area of a nonvolatile memory;
   when moving the page data to one other page, reading the page data into a page buffer before the start of programming in the one other page;
   reading the page data outside the chip to check for errors; and
   programming the data stored in the page buffer into the one other page.

5. A semiconductor memory system data copying method comprising:
   reading page data into a page buffer;
   reading the page data outside the chip to check for errors;
   when having found an error, writing to correct the erroneous part of the data in the page buffer or writing into the entire page; and
   programming in the one other page.

6. A semiconductor memory system data copying method comprising:
   reading specific page data stored in a memory cell array via a sense amplifier into a page buffer in a normal read operation;
   causing a controller to issue an address for a page copy destination and a data input command and inputting the address for the copy destination to a memory section;
   executing a program command;
   programming data into the page copy destination;
   issuing a command to output the data in the page buffer during a program period;
   reading the page data in a copy source stored in the page buffer into the controller; and
   storing the data received at the controller into a buffer memory via an ECC circuit.

7. The semiconductor memory system data copying method according to claim 6, further comprising making a copy into another block, when it becomes clear that correction is necessary.

8. A semiconductor memory system data copying method comprising:
   reading specific page data in a memory cell array into a page buffer via a sense amplifier in a normal read operation;
   reading the page data from the page buffer into a controller through serial output;
   causing the controller to store the received data into a buffer memory via an ECC circuit;
   correcting collapsed data in the buffer memory, when there is an error in the page data and the error is correctable;
   causing the controller to issue an address for a page copy destination and a data input command;
   inputting the address for the copy destination to a memory section and holding the already read-out data in the copy source;

inputting a program command; and programming data into the page copy destination.

9. The semiconductor memory system data copying method according to claim 8, further comprising writing only a corrected part of the data stored in the buffer memory, into the page buffer, before the inputting the program command.

10. The semiconductor memory system data copying method according to claim 8, further comprising writing correct page data over the data stored in the buffer memory, before the inputting the program command.

* * * * *